(12) United States Patent
Cygan et al.

(10) Patent No.: US 8,149,027 B2
(45) Date of Patent: Apr. 3, 2012

(54) CIRCUIT WITH A VOLTAGE DEPENDENT RESISTOR FOR CONTROLLING AN ON/OFF STATE OF A TRANSISTOR

(75) Inventors: Lawrence F. Cygan, Schaumburg, IL (US); Andrew M. Khan, Schamburg, IL (US); Curtis M. Williams, Schaumburg, IL (US)

(73) Assignee: Motorola Mobility, Inc., Libertyville, IL (US)

( * ) Notice: Subject to any disclaimer, the term of this patent is extended or adjusted under 35 U.S.C. 154(b) by 798 days.

(21) Appl. No.: 12/166,882

(22) Filed: Jul. 2, 2008

(65) Prior Publication Data

US 2010/0001701 A1    Jan. 7, 2010

(51) Int. Cl.
*H03K 3/00* (2006.01)
(52) U.S. Cl. ......... 327/110; 327/423; 327/430; 327/588
(58) Field of Classification Search .................. 327/110, 327/423, 430, 588
See application file for complete search history.

(56) References Cited

U.S. PATENT DOCUMENTS 4,860,189 A * 8/1989 Hitchcock ..................... 363/132
5,453,717 A * 9/1995 Gerfault ......................... 330/146
(Continued)

FOREIGN PATENT DOCUMENTS
JP        3112397 A    5/1991
(Continued)

OTHER PUBLICATIONS

Jung, Byeong Hong: "The International Search Report and the Written Opinion of the International Searching Authority", Korean Intellectual Property Office, Daejeon, Republic of Korea, completed: Feb. 9, 2010, mailed: Feb. 10, 2010, all pages.

*Primary Examiner* — Kenneth B. Wells

(57) ABSTRACT

An H-bridge circuit formed from two sub-circuits coupled to each other by a load network across a respective load node of each of the sub-circuits. Each sub-circuit of the two sub-circuits comprises a depletion mode upper transistor with a second electrode coupled to a first electrode of a lower transistor. The load node of the sub-circuit is disposed between the second electrode of the upper transistor and the first electrode of a lower transistor. There is a first voltage supply node coupled to a first electrode of the upper transistor and a second voltage supply node is coupled to a second electrode of the lower transistor. An upper driver transistor selectively couples a gate electrode of the upper transistor to an upper drive voltage node, the upper driver transistor having a control electrode coupled to an upper switched voltage supply circuit. There is also a lower switched voltage supply circuit coupled to a gate electrode of the lower transistor and a voltage dependent non-linear resistor is coupled across the gate electrode and second electrode of the upper transistor. In use, when the lower transistor and upper driver transistor are in a non-conductive state a potential difference across the voltage dependent non-linear resistor is sufficiently small enough to control the upper transistor into a conductive state. Conversely, when the lower transistor and upper driver transistor are in a conductive state the potential difference across the voltage dependent non-linear resistor provides a negative bias to the gate electrode of the upper transistor that has a negative potential sufficient to control the upper transistor into a non-conductive state.

25 Claims, 8 Drawing Sheets

U.S. PATENT DOCUMENTS

| | | |
|---|---|---|
| 5,666,280 A | 9/1997 | Janaswamy et al. |
| 5,969,964 A | 10/1999 | Mangtani |
| 6,072,361 A | 6/2000 | Myers et al. |
| 6,331,794 B1 | 12/2001 | Blanchard |
| 6,477,413 B1 * | 11/2002 | Sullivan et al. ................... 607/5 |
| 6,486,733 B2 | 11/2002 | Myers et al. |
| 6,538,279 B1 | 3/2003 | Blanchard |
| 6,650,558 B1 * | 11/2003 | Pacala et al. .................. 363/132 |
| 7,215,189 B2 | 5/2007 | Wilhelm |
| 7,262,658 B2 | 8/2007 | Ramaswamy et al. |
| 7,304,352 B2 | 12/2007 | Muller et al. |
| 2006/0132234 A1 | 6/2006 | Nguyen |
| 2007/0132509 A1 | 6/2007 | Mochizuki |

FOREIGN PATENT DOCUMENTS

| | | |
|---|---|---|
| JP | 2005020264 A | 1/2005 |

\* cited by examiner

Q1 & Q4 SATURATED, Q2 & Q3 CUTOFF
(PRIOR ART)

PATENT

CIRCUIT WITH A VOLTAGE DEPENDENT RESISTOR FOR CONTROLLING AN ON/OFF STATE OF A TRANSISTOR

FIELD OF THE INVENTION

The present invention relates generally to circuits comprising one or more depletion mode transistors. The invention is specifically useful for, but not necessarily limited to, H-Bridge or half H-Bridge circuits used for conversion of digital data to high power Radio Frequency signals or radio frequency power amplification.

BACKGROUND OF THE INVENTION

Circuits that include transistors used as controllable switches or variable resistors come in various topologies including H-Bridge topologies, half H-bridge topologies and tuned amplifier topologies. Further, circuits operating as Radio Frequency (RF) power amplifiers have traditionally been implemented in a tuned amplifier topology in which input and output networks of the power amplifiers effectively resonate at a desired operating frequency. Resonant frequency operation allows parasitic reactance, such a shunt capacitance and series inductance, to be absorbed into the networks, thereby maximizing the energy transfer from the driving source to the amplifier and from the amplifier to the load. Optimal performance of such tuned amplifiers is achievable over a limited operating bandwidth, but more importantly, over a narrow range of power levels. As a result, modulation formats which have large peak-to-average ratios typically exhibit poor efficiency when amplified by tuned amplifier topologies.

Recent advances in high frequency semiconductors and digital signal processing software and hardware suggest that efficient RF power amplifiers for modulation formats with large peak-to-average ratios may be realized using non-resonant amplifier topologies which are driven by switch-mode waveforms. The H-Bridge is one suitable topology that is commonly used in motor control applications and has been adapted for use in digital audio amplifiers. The H-Bridge topology includes a left sub-circuit and a right sub-circuit, each of the sub-circuits includes an upper transistor and a lower transistor and a load is connected across the sub-circuits at nodes between the upper and lower transistors.

In operation, complementary transistors, comprising an upper transistor in one sub-circuit (limb) and a lower transistor in the opposite sub-circuit (limb), are alternately turned on causing current to flow through the load from left to right and then right to left. In low frequency applications, the upper transistors are typically P-channel enhancement-mode Field Effect Transistors (FETs), while N-channel enhancement-mode FETs are used for the lower transistors. The P-channel devices are turned on using a drive waveform which pulls their gate voltage toward ground. Conversely, the N-channel devices are turned on when their gate voltage is raised above ground. This complementary symmetry allows the H-Bridge topology to be driven by a simple ground-referenced circuit design.

The H-Bridge topology when used as a power amplifier in high frequency radio applications can have limitations when using both P-channel enhancement-mode Field Effect Transistors (FETs) and N-channel enhancement-mode FETs. This is because the poorer mobility of holes (in P-channel devices) in comparison to electrons (in N-channel devices) results in the gain-bandwidth product (Fτ) of P-channel devices being typically one-half to two-thirds that of N-channel devices. In addition, the lower transconductance of P-channel devices requires fabrication of a physically larger device structure in order to match the current capability of N-channel devices. The larger device increases shunt capacitance, further limiting high frequency performance.

An H-Bridge topology may be constructed using all N-channel devices to improve high frequency operation. However, such a configuration presents a challenging driver design problem as the source voltage of the upper transistors are not fixed. As a result, a relatively large gate voltage swing (referenced to ground) is required by the upper transistors to turn them from an on state to an off state. Such large gate to source voltage swings require significant drive power in order for transistors to change from a conductive state to a non-conductive state and vice versa especially in RF applications. Thus, although the all N-channel H-Bridge topologies are able to operate at high frequencies as power amplifiers, they require relatively large gate voltage swings to control (switch) the upper transistors. A means to provide a small, ground-referenced drive signal to the upper transistors is therefore critical to efficient operation of such topologies.

BRIEF DESCRIPTION OF THE DRAWINGS

In order that the invention may be readily understood and put into practical effect, reference now will be made to exemplary embodiments as illustrated with reference to the accompanying figures, wherein like reference numbers refer to identical or functionally similar elements throughout the separate views. The figures together with a detailed description below, are incorporated in and form part of the specification, and serve to further illustrate the embodiments and explain various principles and advantages, in accordance with the present invention, where.

Figure 1:
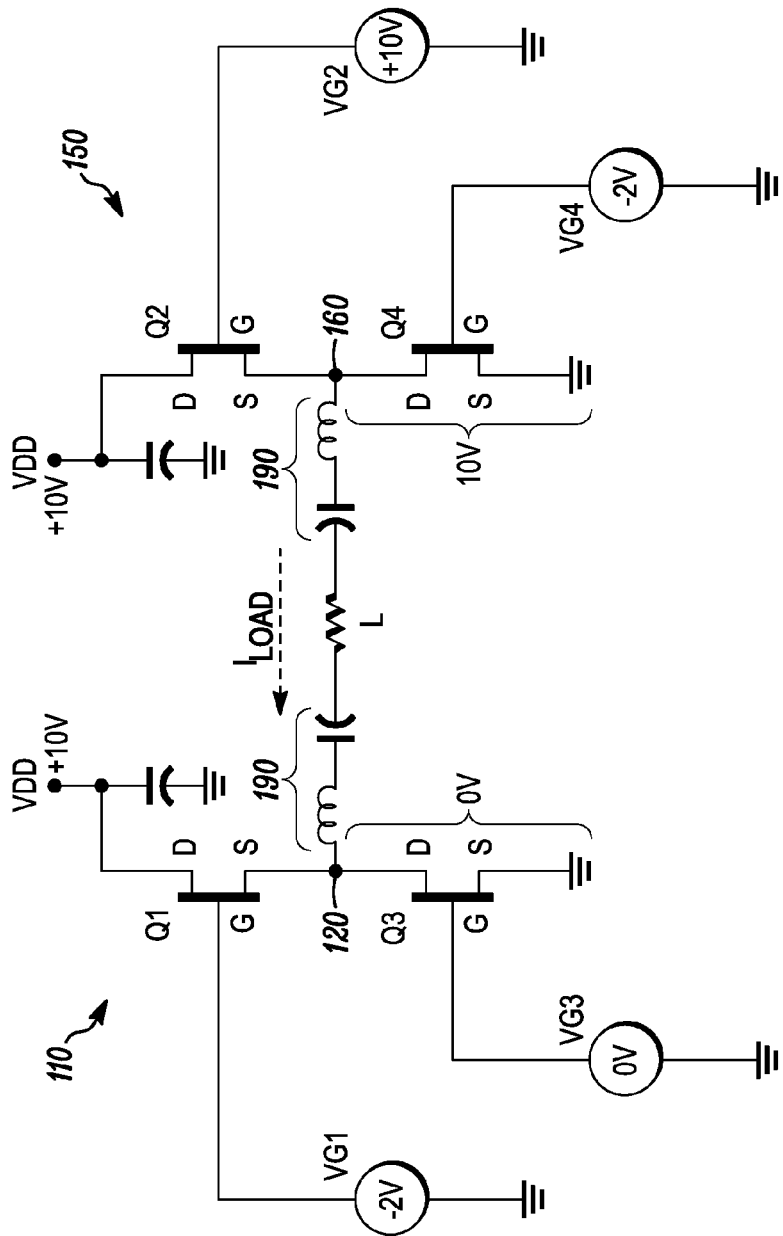
FIG. 1 is a schematic diagram illustrating a Prior Art H-Bridge circuit, in the form of an H-Bridge amplifier in a first operating state.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in circuit components. Accordingly, the circuit components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that device components that comprises a list of elements does not include only those elements but may include other elements not expressly listed or inherent to such a circuit component. An element proceeded by "comprises . . . a" does not, without more constraints, preclude the existence of additional identical elements in the circuit that comprises the element.

Referring to FIG. 1, there is illustrated a schematic diagram of a Prior Art H-Bridge circuit, in the form of an H-Bridge amplifier 100 in a first operating state. The H-Bridge amplifier 100 comprises a right sub-circuit (limb) 150 and an opposite left sub-circuit (limb) 110. The left sub-circuit 110 includes an upper transistor Q1 having a drain electrode coupled to the supply voltage VDD and a lower transistor Q3 having a source electrode coupled to ground. The source of the upper transistor Q1 and drain of the lower transistor Q3 are coupled together at a left sub-circuit load node 120. A gate electrode of the upper transistor Q1 is connected to a switched voltage supply VG1 and a gate electrode of the lower transistor Q3 is connected to a switched voltage supply VG3.

The right sub-circuit 150 includes an upper transistor Q2 having a drain electrode coupled to the supply voltage VDD and a lower transistor Q4 having a source electrode coupled to ground. The source of the upper transistor Q2 and drain of the lower transistor Q4 are coupled together at a right sub-circuit load node 160. A gate electrode of the upper transistor Q2 is connected to a switched voltage supply VG2 and a gate electrode of the lower transistor Q4 is connected to a switched voltage supply VG4. A load network, comprising a load L and band pass filters 190, is connected across the left and right sub-circuits 110,150, specifically between the left sub-circuit load node 120 and the right sub-circuit load node 160.

In the operating state of FIG. 1 the supply voltage VDD is set to +10 Volts, switched voltage supply VG1 is set to −2 Volts, switched voltage supply VG2 is set to +10 Volts, switched voltage supply VG3 is set to 0 Volts and switched voltage supply VG4 is set to −2 Volts. In this example, all of the transistors Q1,Q2,Q3,Q4 are N-channel depletion mode FETs and each of the transistors Q1,Q2,Q3,Q4 have a characteristic in which they are turned on (in a conductively saturated state) for Vgs=0 v, and turned off (in a cut-off or non-conductive state) for Vgs=−2 v. Hence, the upper transistor Q2 and the lower transistor Q3 are turned on and are in a conductively saturated mode, whereas the upper transistor Q1 and the lower transistor Q4 are turned off and are in a cut-off or non-conductive state. Consequently, a current $I_{LOAD}$ flows from the supply voltage VDD through the upper transistor Q2, through the load L, through the band pass filters 190 and to ground via the lower transistor Q3.

Figure 2:
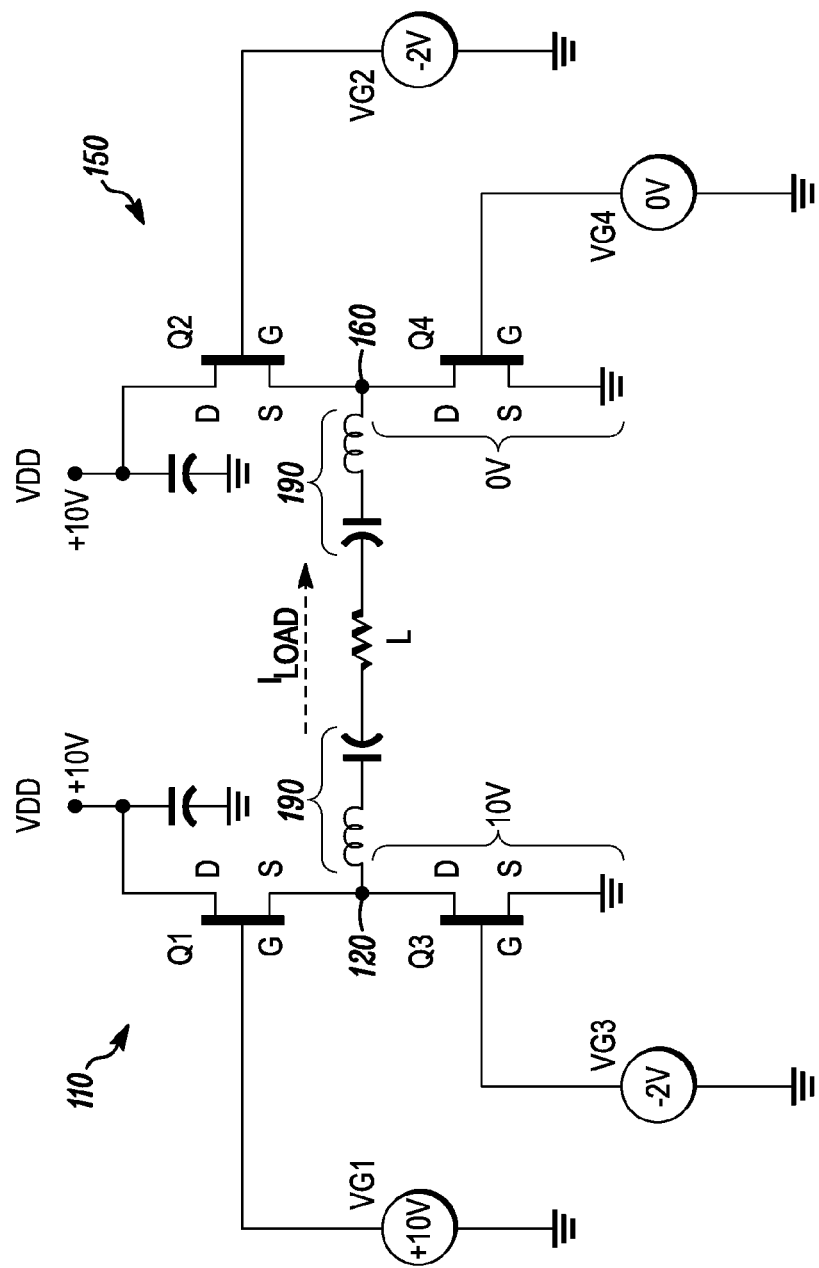
FIG. 2 is a schematic diagram illustrating the Prior Art H-Bridge circuit of FIG. 1 in a second operating state.

Referring to FIG. 2, there is illustrated a schematic diagram of the Prior Art H-Bridge amplifier 100 in a second operating state. The supply voltage VDD is set to +10 Volts, switched voltage supply VG1 is set to +10 Volts, switched voltage supply VG2 is set to −2 Volts, switched voltage supply VG3 is set to −2 Volts and switched voltage supply VG4 is set to 0 Volts. As a result, the upper transistor Q1 and the lower transistor Q4 are turned on and are in a conductively saturated state or conductive state whereas the upper transistor Q2 and the lower transistor Q3 are turned off and are in a cut-off or non-conductive state. Thus a current $I_{LOAD}$ flows from the supply voltage VDD through the upper transistor Q1, through the load, through the band pass filters 190 and to ground via the lower transistor Q4.

From the above it is clear that a drive voltage swing, provided by switched voltage supplies VG1, VG2, at the respective gate electrodes of upper transistors Q and Q2 must extend over a 12 volt range, from +10 to −2 volts, in order to change state. Conversely, the sources of the lower transistors Q3 and Q4 are connected to ground, allowing the lower transistors Q3 and Q4 to change state with a drive voltage swing of only 2 volts (0 v to −2 v), provided by switched voltage supplies VG3, VG4, at the respective gate electrodes of lower transistors Q3 and Q4. The relatively large gate voltage swings of 12 volts that are provided by switched voltage supplies VG1, VG2 requires significant drive power in order for the transistors Q1 and Q2 to change states rapidly, as required in RF applications. Such gate voltage swings of 12 volts are undesirable and may result in unnecessary power consumption especially in portable battery powered devices.

Figure 3:
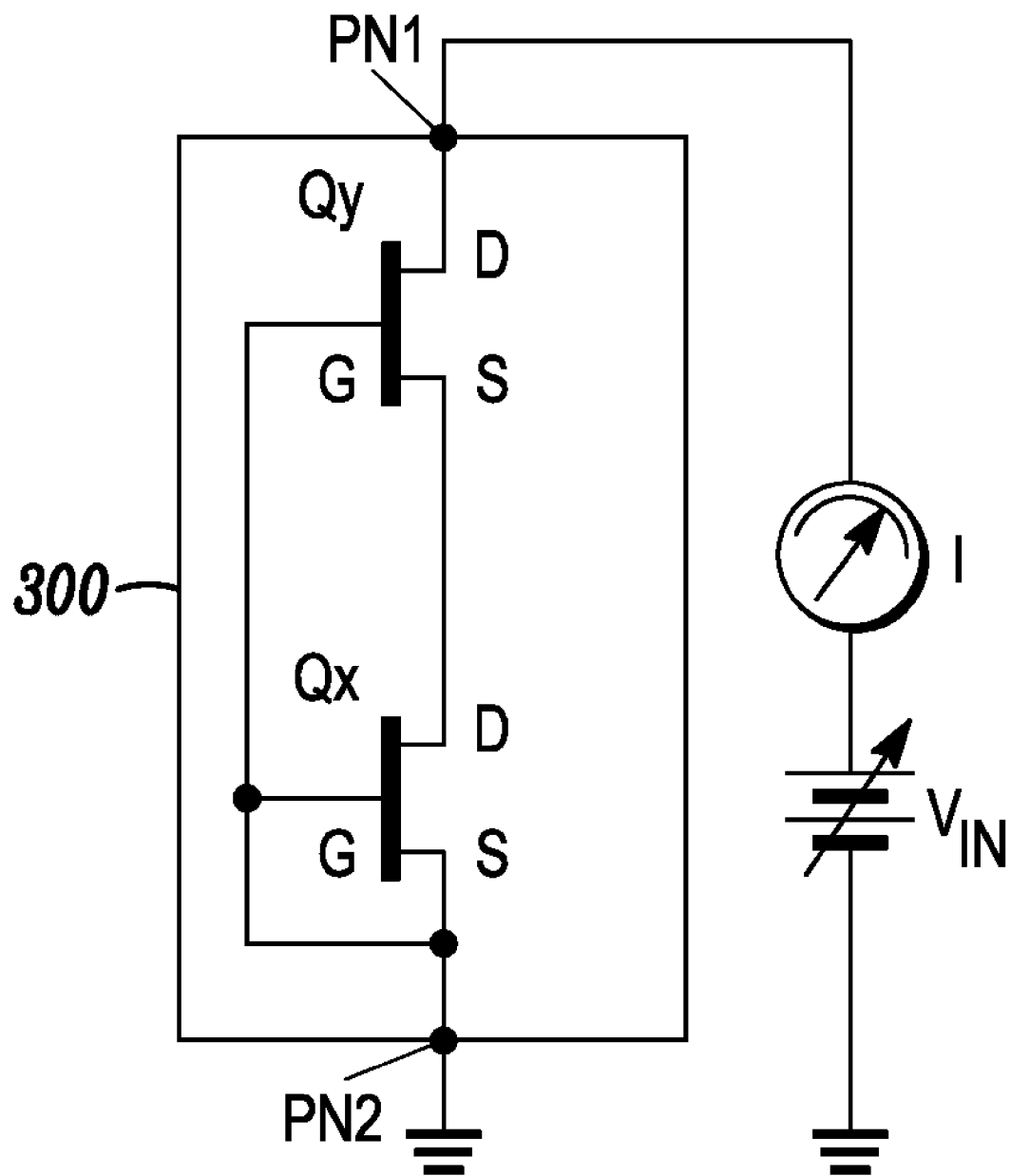
FIG. 3 is a schematic diagram illustrating a voltage dependent non-linear resistor coupled to a variable voltage supply according to an exemplary embodiment of the present invention.

Referring to FIG. 3, there is illustrated a schematic diagram of a voltage dependent non-linear resistor 300 coupled to a variable voltage supply Vin. The voltage dependent non-linear resistor 300 comprises two series connected depletion mode Field Effect Transistors (typically GaAs or GaN N-channel Field Effect Transistors). A first one of the series connected depletion mode Field Effect transistors Qx has a gate electrode G and a second electrode, namely a source electrode S, directly coupled together and a first electrode, namely a drain electrode D, coupled to a second electrode, namely a source electrode S, of a second one of the series connected depletion mode Field Effect transistors Qy.

The second one of the series connected depletion mode Field Effect transistors Qy has a first electrode, namely a drain electrode D, series coupled at a first peripheral node PN1 to an ammeter I that is connected to a positive electrode of the variable voltage supply Vin. Also, the gate electrode G of the second one of the series connected depletion mode Field Effect transistors Qy is directly coupled to the source electrode S of the first one of the series connected depletion mode Field Effect transistors Qx and this source electrode S is coupled at a second peripheral node PN2 to a negative electrode of the variable voltage supply Vin.

Figure 4:
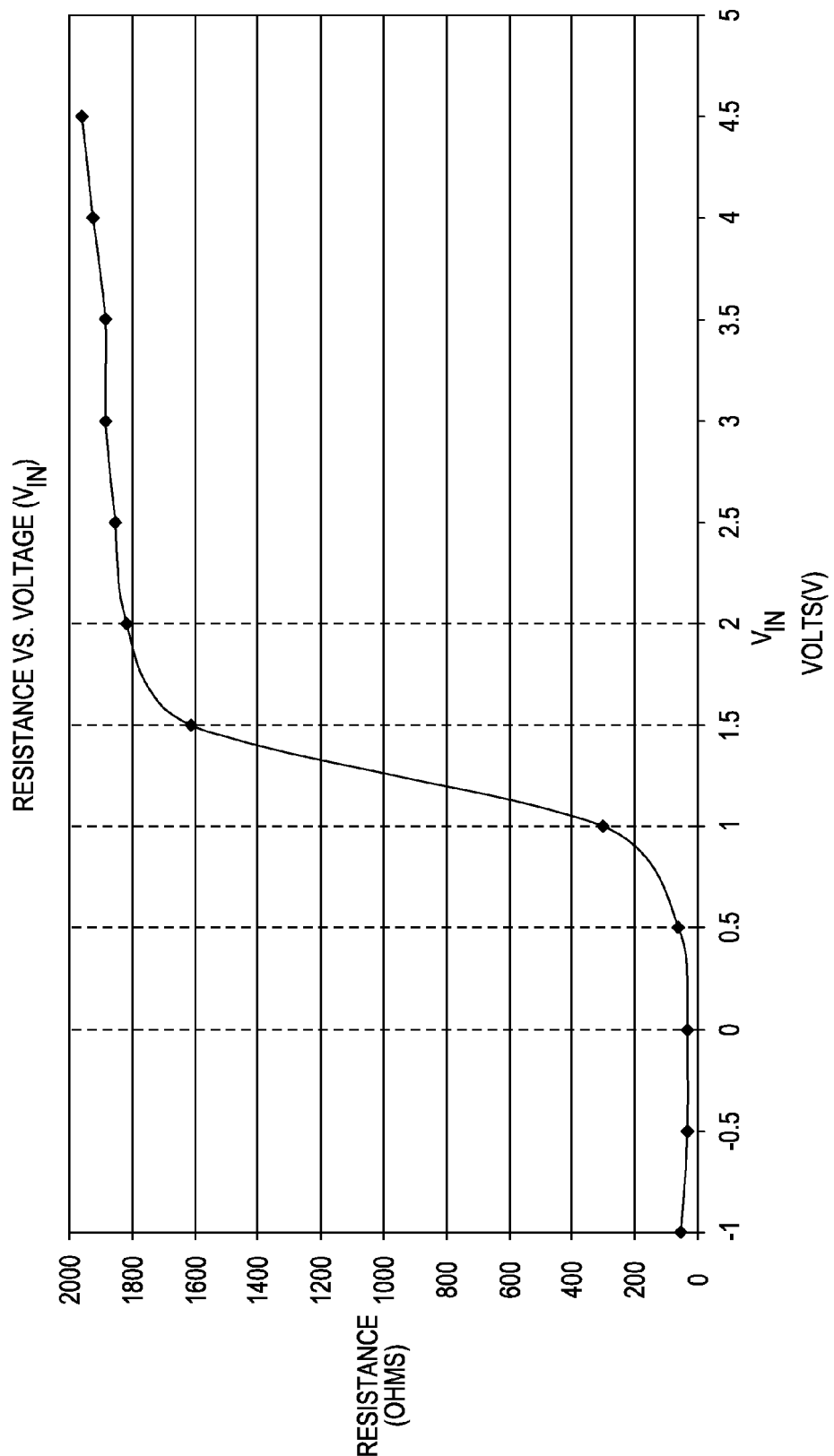
FIG. 4 is a graph illustrating a Resistance vs. Voltage characteristic of the voltage dependent non-linear of FIG. 3.

The voltage dependent non-linear resistor 300 has a Resistance vs. Voltage characteristic as shown in the graph of FIG. 4. The Resistance vs. Voltage characteristic is determined by the voltage output of the variable voltage supply Vin being an independent variable, therefore the current through the circuit becomes a dependent variable. Accordingly, using the simple equation Resistance=Voltage/Current the varying voltage dependent resistance appearing across the voltage dependent non-linear resistor 300 can be determined for a range of voltages shown in FIG. 4. For instance, when the variable voltage supply Vin=0, the voltage dependent non-linear resistor 300 has a low resistance state of about 33 ohms. This resistance stays almost constant whilst Vin is in the range −1 Volts to +0.5 Volts and even when Vin=1.0 Volt the resistance of the voltage dependent non-linear resistor 300 is relatively low (300 ohms). In contrast, when Vin=1.5 Volts, the resistance of the voltage dependent non-linear resistor 300 is relatively high (1,600 ohms). When Vin is in the range of 1.0 Volts to 1.5 Volts the resistance of the voltage dependent non-linear resistor 300 changes by more than 1,000 ohms over this 0.5 Volt range and when Vin>2 Volts the variations in the resistance of the voltage dependent non-linear resistor 300 are less affected by small changes in Vin. In summary, the voltage dependent non-linear resistor 300 can be considered to be: (a) in a low resistance state when the voltage Vin is below 1 Volt; and (b) in a high resistance state when the voltage Vin is greater than 1.5 volts.

Figure 5:
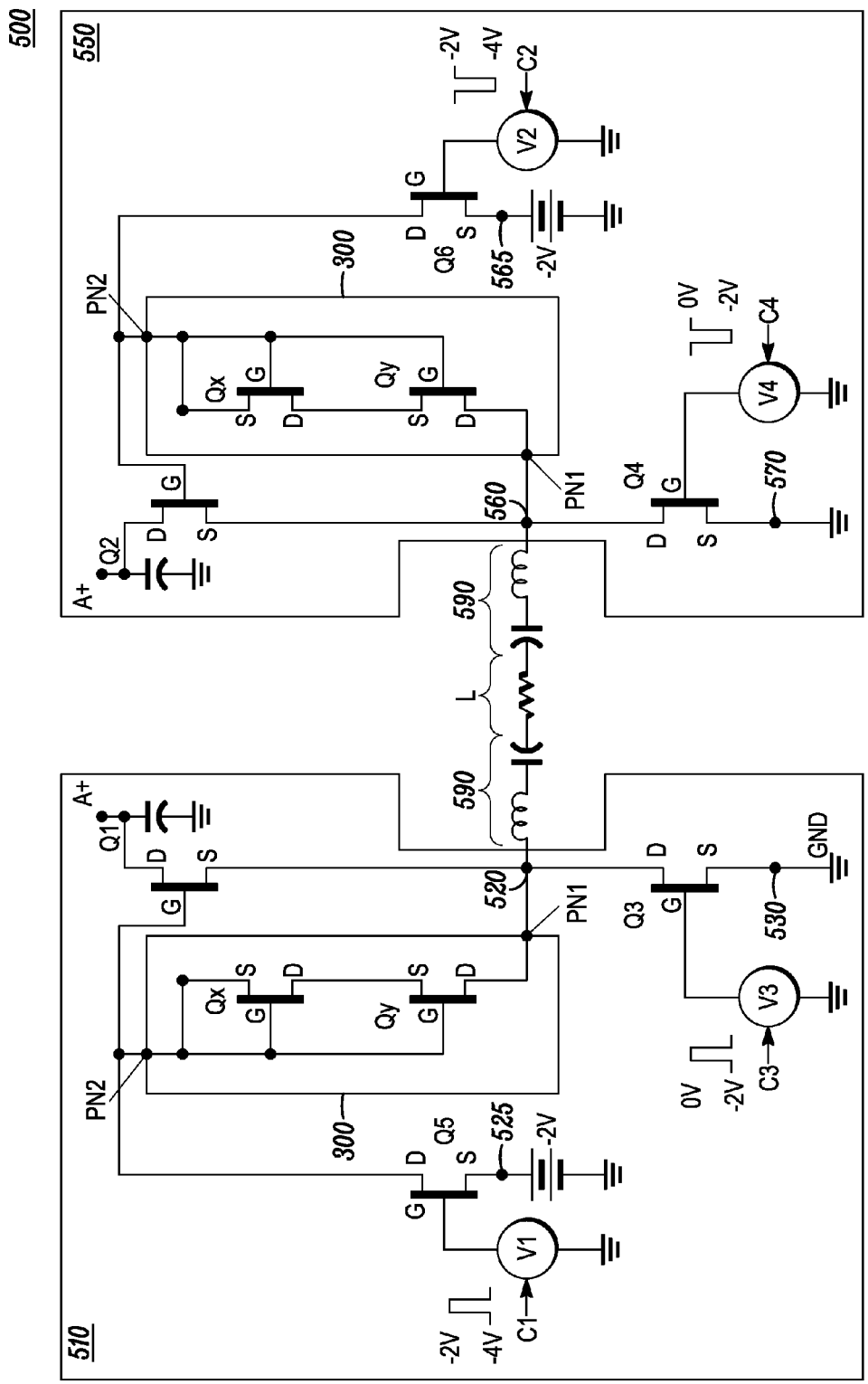
FIG. 5 is a schematic diagram illustrating an exemplary embodiment of a H-bridge circuit using the voltage dependent non-linear of FIG. 3 according to the present invention.

Referring to FIG. 5 there is illustrated an H-bridge circuit 500 comprising two sub-circuits 510, 550 (typically formed from transistors that are only depletion mode N-channel Field Effect Transistors) coupled to each other by a load network comprising a load L across respective load nodes 520, 560 associated with each of the sub-circuits 510, 550. In this embodiment each sub-circuit of the two sub-circuits 510, 550 are identical and series coupled to either side of the load L by band pass filters 590. A left one of the sub-circuits 510 (left sub-circuit) comprises a depletion mode upper transistor Q1 (FET) with a second electrode, namely a source electrode S, coupled to a first electrode, namely a drain electrode D, of a lower transistor Q3. The load node 520 is disposed between the source electrode S of the upper transistor Q1 and the drain electrode D of a lower transistor Q3. A first voltage supply node A+ (connected to a supply voltage of about +10 Volts) is coupled to a first electrode, namely a drain electrode D, of the upper transistor Q1 and a second voltage supply node 530 is coupled to both ground GND and a second electrode, namely a source electrode S, of the lower transistor Q3. There is an upper driver transistor Q5 selectively coupling a gate electrode G of the upper transistor Q1 to an upper drive voltage node 525, the upper driver transistor Q5 has a control electrode (gate electrode G) coupled to an upper switched voltage supply circuit V1. The upper drive voltage node 525 as shown is connected to a voltage source that supplies a negative voltage that is typically at least −2 volts and the upper switched voltage supply circuit V1 provides a voltage of either −2 Volts or −4 Volts. There is also a lower switched voltage supply circuit V3 coupled to a gate electrode G of the lower transistor Q3 and as shown, the lower switched voltage supply circuit V3 provides a voltage of either 0 Volts or −2 Volts.

The left one of the sub-circuits 510 also comprises a voltage dependent resistor VDR. In the embodiment illustrated, this voltage dependent resistor VDR is the voltage dependent non-linear resistor 300 that is coupled across the gate electrode G and source electrode S of the upper transistor Q1. More specifically, the first one of the series connected depletion mode Field Effect transistors Qx of the voltage dependent resistor VDR has the gate electrode G and source electrode S directly coupled together that are also coupled to the gate electrode G of the upper transistor Q1 at the second peripheral node PN2. The drain electrode D of the first one of the series connected depletion mode Field Effect transistors Qx is coupled to the source electrode S of the second one of the series connected depletion mode Field Effect transistors Qy. The second one of the series connected depletion mode Field Effect transistors Qy has its drain electrode D coupled, at the first peripheral node PN1, to the source electrode S of the upper transistor Q1 which is also connected to the load node 520. Also, the gate electrode G of the second one of the series connected depletion mode Field Effect transistors Qy is directly coupled to the source electrode S of the first one of the series connected depletion mode Field Effect transistors Qx.

In use, when the lower transistor Q3 and upper driver transistor Q5 are in a non-conductive state (switched off), no potential difference appears across the voltage dependent non-linear resistor 300, causing it to present a low impedance across the gate-source electrodes of the upper transistor Q1. This effectively connects the gate and source electrodes of Q1 together, placing Q1 into a conductive state (switched on). Conversely, when the lower transistor Q3 and upper driver transistor Q5 are in a conductive state, the potential difference across the voltage dependent non-linear resistor 300 establishes a negative bias across the gate-source electrodes of Q1 (Vgs=−2 Volts, since the source of Q1 is pulled to ground by Q3). This negative bias places upper transistor Q1 in a non-conductive state (switched off). Further, the potential difference (2 Volts) across PN1 and PN2 of voltage dependent non-linear resistor 300 causes it to revert to its high resistance state. The high resistance property limits the current flowing into the upper drive voltage node 52 via Q5.

From the analysis of the voltage dependent non-linear resistor 300 as mentioned in FIGS. 3 and 4, a low resistance state of the voltage dependent non-linear resistor 300 occurs when the voltage across the gate electrode G and source electrode S of the upper transistor is below 1 Volt. Conversely, the voltage dependent non-linear resistor 300 is in a high resistance state when a voltage across the gate electrode and source electrode S of the upper transistor Q3 is greater than 1.5 volts.

As mentioned above, in this embodiment each sub-circuit of the two sub-circuits 510, 550 are identical. Hence, the right one of the sub-circuits 550 (right sub-circuit) also comprises a depletion mode upper transistor Q2 (FET) with a second electrode, namely a source electrode S, coupled to a first electrode, namely a drain electrode D, of a lower transistor Q4. The load node 560 is disposed between the source electrode S of the upper transistor Q2 and the drain electrode D of a lower transistor Q4. The first voltage supply node A+ (connected to a supply voltage of about +10 Volts) is coupled to a first electrode, namely a drain electrode D, of the upper transistor Q2 and a second voltage supply node 570 is both coupled to ground GND and to a second electrode, namely a source electrode S, of the lower transistor Q4. There is an upper driver transistor Q6 selectively coupling a gate electrode G of the upper transistor Q2 to an upper drive voltage node 565, the upper driver transistor Q6 has a control electrode (gate electrode G) coupled to an upper switched voltage supply circuit V2. The upper drive voltage node 565 as shown is coupled to a −2 Volt power supply (this power supply is typically at least −2 volts) and the upper switched voltage supply circuit V2 provides a voltage of either −2 Volts or −4 Volts. There is also a lower switched voltage supply circuit V4 coupled to a gate electrode G of the lower transistor Q4 and as shown the lower switched voltage supply circuit V3 provides a voltage of either 0 Volts or −2 Volts.

The right one of the sub-circuits 550 also comprises a voltage dependent resistor VDR and in the embodiment illustrated this voltage dependent resistor VDR is specifically the voltage dependent non-linear resistor 300 that is coupled across the gate electrode and source electrode of the upper transistor Q2. In use, when the lower transistor Q4 and upper driver transistor Q6 are in a non-conductive state (switched off), no potential difference appears across the voltage dependent non-linear resistor 300, causing it to present a low impedance across the gate-source electrodes of the upper transistor Q2. This effectively connects the gate and source electrodes of Q2 together, placing Q2 into a conductive state (switched on). Conversely, when the lower transistor Q4 and upper driver transistor Q6 are in a conductive state, the potential difference across the voltage dependent non-linear resistor 300 establishes a negative bias voltage across the gate-source electrodes of Q2 (Vgs=−2 Volts, since the source of Q2 is pulled to ground by Q4). This negative bias voltage places upper transistor Q2 in a non-conductive state (switched off). Further, the potential difference (2 Volts) across PN1 and PN2 of voltage dependent non-linear resistor 300 causes it to revert to its high resistance state. The high resistance property limits the current flowing into the upper driver voltage node 565 via Q6.

From the above, it will be apparent that for either of the sub-circuits 510, 550 when their respective lower transistors Q3, Q4 and upper driver transistors Q5,Q6 are in a non-conductive state, a potential difference across the voltage dependent non-linear resistor 300 is sufficiently small enough to control the respective upper transistors Q1, Q2 into a conductive state. Furthermore, when the respective lower transistor Q3,Q4 and upper driver transistors Q1,Q2 are in a conductive state, the potential difference across the voltage dependent non-linear resistors 300 provides a negative bias voltage to the gate electrode G of the respective upper transistors Q1,Q2 that has a negative potential sufficient to control the respective upper transistors Q1,Q2 into a non-conductive state.

Figure 6:
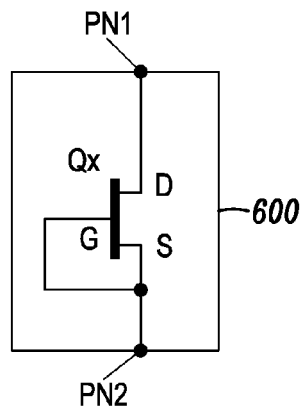
FIG. 6 is a schematic diagram of another exemplary embodiment of the voltage dependent non-linear resistor of FIG. 3.

Referring to FIG. 6, there is illustrated a schematic diagram of another embodiment of the voltage dependent resistor VDR that can be used in both the sub-circuits 510, 550 instead of the voltage dependent non-linear resistor 300. In this embodiment the voltage dependent resistor VDR is a voltage dependent non-linear resistor 600 comprising an N-channel depletion mode Field Effect transistor Qx having a gate electrode G and a second electrode, namely a source electrode S, directly coupled together. A first electrode, namely a drain electrode D, of the single depletion mode Field Effect transistor Qx is coupled at a first peripheral node PN1 and to the second electrode (source electrode S) of the upper transistor Q1 for sub-circuit 510 or Q2 for sub-circuit 550. Also, the source node of the single depletion mode Field Effect transistor Qx is coupled at a second peripheral node PN2 and to the gate electrode of the upper transistor Q1 for sub-circuit 510 or to the gate electrode of the upper transistor Q2 for sub-circuit 550.

Figure 7:
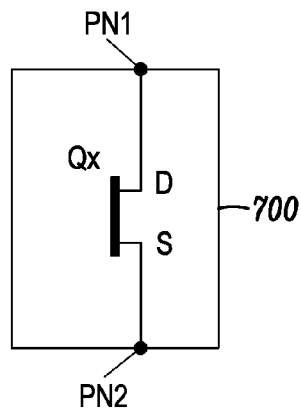
FIG. 7 is a schematic diagram of another exemplary embodiment of the voltage dependent non-linear resistor of FIG. 3.

Referring to FIG. 7, there is illustrated a schematic diagram of another embodiment of the voltage dependent resistor VDR that can be used in both the sub-circuits 510, 550 instead of the voltage dependent non-linear resistor 300. In this embodiment the voltage dependent resistor VDR is a voltage dependent non-linear resistor 700 comprising a gateless N-channel depletion mode Field Effect transistor Qx typically known as a "deep channel" resistor or saturated resistor.

A first electrode, namely a drain electrode D, of the depletion mode Field Effect transistor Qx is coupled at a first peripheral node PN1 to the second electrode (source electrode S) of the upper transistor Q1 for sub-circuit 510 or Q2 for sub-circuit 550. Also, a second electrode, namely a source electrode S, of the depletion mode Field Effect transistor Qx is coupled at a second peripheral node PN2 and to the gate electrode of the upper transistor Q1 for sub-circuit 510 or to the gate electrode of transistor Q2 for sub-circuit 550.

Figure 8:
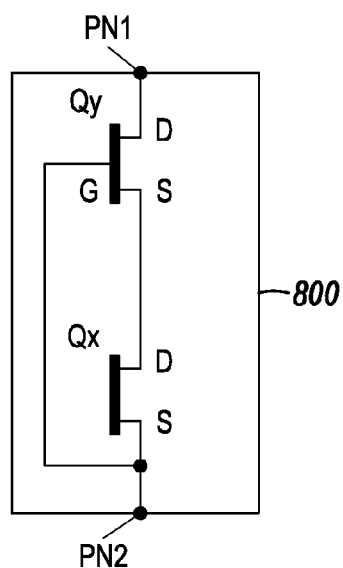
FIG. 8 is a schematic diagram of another exemplary embodiment of the voltage dependent non-linear resistor of FIG. 3.

Referring to FIG. 8, there is illustrated a schematic diagram of another embodiment of the voltage dependent resistor VDR that can be used in both the sub-circuits 510, 550 instead of the voltage dependent non-linear resistor 300. In this embodiment the voltage dependent resistor VDR is a voltage dependent non-linear resistor 800 comprising two series connected N-channel depletion mode Field Effect transistors, a first one of the series connected depletion mode Field Effect transistors Qx comprising a gateless N-channel depletion mode Field Effect transistor with a first electrode (drain electrode D) coupled to a second electrode (source electrode) of a second one of the series connected depletion mode Field Effect transistors Qy. The second one of the series connected depletion mode Field Effect transistors Qy has a first electrode (drain electrode D) coupled at a first peripheral node PN1 and to the second electrode (source electrode S) of the upper transistor Q1 for sub-circuit 510 or Q2 for sub-circuit 550. Also, a gate electrode G of the second one of the series connected depletion mode Field Effect transistors Qy is directly coupled to a second electrode (source electrode S) of the first one of the series connected depletion mode Field Effect transistors Qx; and both of these electrodes are coupled at a second peripheral node PN2 to the gate electrode of the upper transistor Q1 for sub-circuit 510 or gate electrode of upper transistor Q2 for sub-circuit 550.

A basic two state binary signaling operation of the H-bridge circuit 500 will now be described with particular reference to the left one of the sub-circuits 510. The signaling operation is essentially controlled by drive signals applied to control inputs C1 to C4 of the respective switched voltage supply circuits V1 to V4. This basic two state binary signaling operation also applies if the voltage dependent non-linear resistor 300 is replaced with any one voltage dependent resistor VDR such as any of the voltage dependent non-linear resistors 600, 700, 800.

In a first state the upper switched voltage supply circuit V1 is at a low level logic state of −4 volts and the lower switched voltage supply circuit V3 is at a low level logic state of −2 Volts and therefore the upper driver transistor Q5 and the lower transistor Q3 are switched off (in a non-conducting or high resistance state). Since the upper driver transistor Q5 is switched off, the −2 Volt power supply (−2 Volt bias) is prevented from being applied to the gate electrode G of the upper transistor Q1. Also, since the lower transistor Q3 is switched off there is no coupling of the load node 520 to ground through the lower transistor Q3. Hence, as a consequence of both the lower transistor Q3 and driver transistor Q5 being switched off, there is no potential difference across the voltage dependent non-linear resistor 300 at the first and second peripheral nodes PN1, PN2. As a result, the voltage dependent non-linear resistor 300 is in its low resistance state, effectively connecting the gate G and source S of Q1 together, establishing Vgs=0 volts. Since the upper transistor Q1 is a depletion-mode device, it is switched on (i.e. is saturated or is in its conductive state), thereby connecting the load node 520 and thus the load L and band pass filters 590 to the first voltage supply node A+. As will be apparent to a person skilled in the art, the load node 560 is coupled to ground by switching on the lower transistor Q4 by applying a bias of 0 Volts from the lower switching voltage supply circuit V4 whilst the upper transistor Q2 is switched off.

In a second state the upper switched voltage supply circuit V1 becomes a high level logic state of −2 volts and the lower switched voltage supply circuit V3 also becomes a high level logic state of 0 Volts. As a result, the lower transistor Q3 is switched on thereby coupling the load node 520 to ground and the upper driver transistor Q5 is switched on, which couples the −2 Volt power supply (−2 Volt bias) to the gate electrode G of the upper transistor Q1. Hence, the gate to source voltage Vgs of the upper transistor Q1 is biased to −2 Volts. Further, a potential difference of 2 Volts is established across the voltage dependent non-linear resistor 300 at the first and second peripheral nodes PN1, PN2. This results in the voltage dependent non-linear resistor 300 reverting to its high resistance state. The upper transistor Q1 is switched off, into a non-conductive state since Vgs=−2 Volts. Since the load node 520 is coupled to ground through the lower transistor Q3, the load L and band pass filters 590 are also coupled to ground through the lower transistor Q3. As will be apparent to a person skilled in the art, the load node 560 is coupled to the first voltage supply node A+ by switching on the upper transistor Q2 whilst the lower transistor Q4 is switched off by applying a bias of −2 Volts from the lower switching voltage supply circuit V4.

Figure 9:
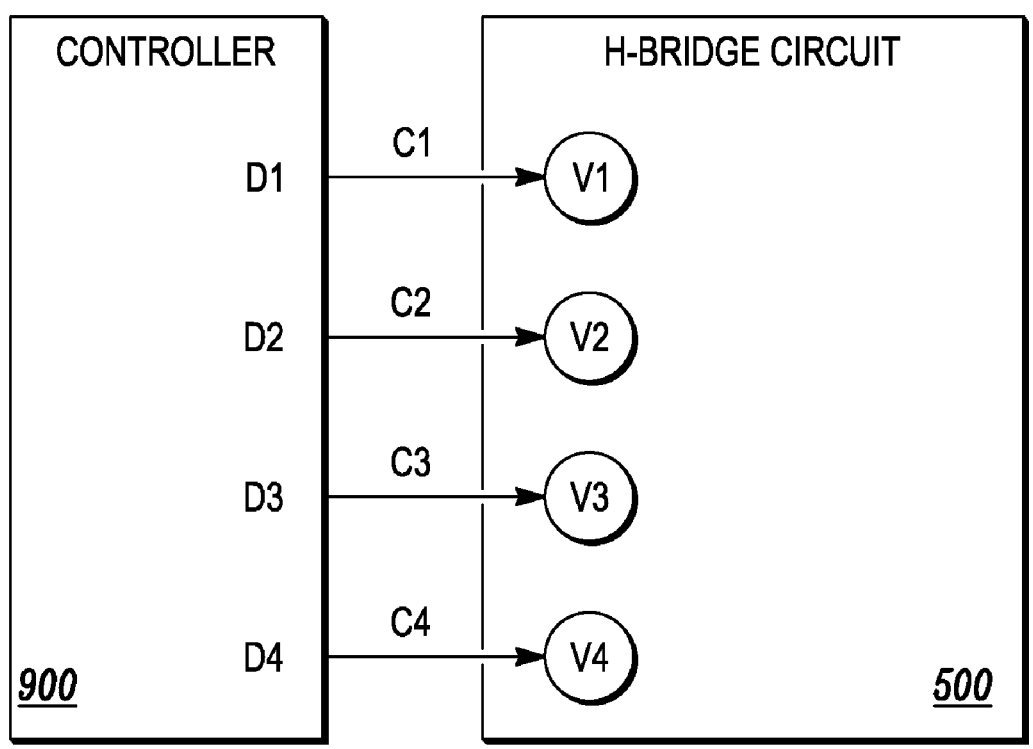
FIG. 9 is a schematic diagram illustrating an exemplary embodiment of control inputs of switched voltage supply circuits forming part of the circuit of FIG. 5 coupled to a controller.

The right one of the sub-circuits 550 operates in an identical fashion to that described above with the upper and lower switched voltage supply circuits V2 and V4 taking on the opposite respective logic level states of the upper and lower switched voltage supply circuits V1 and V3. The control of all the switched voltage supply circuits V1 to V4 is achieved by a controller providing drive signals to respective independent control inputs C1 to C4. In FIG. 9 there is illustrated the control inputs C1 to C4 of the switched voltage supply circuits V1 to V4 coupled to a controller 900. The controller 900 is typically a dedicated signal processor or part of a microprocessor that provides mapping for multiple level signaling formats for the H-Bridge circuit 500. It will be apparent to a person skilled in the art that the voltage dependent resistor VDR that is typically shown as the voltage dependent non-linear resistor 300 can be replaced with any voltage dependent resistor VDR such as, but not limited to, one of the voltage dependent non-linear resistors 600, 700, 800. When the H-Bridge circuit 500 is implemented as a RF amplifier in a modulation system that amplifies a modulated signal, the controller 900 may include a digital to analog converter that is typically a Delta-Sigma converter. However, two state binary signaling, as described above, transfers a constant level of drive power from the switched voltage supply circuits V1 to V4 to the H-Bridge PA. Further, since many modulation systems such as CDMA and OFDM statistically spend much time at low power levels, the constant drive of the binary waveform implies the stage gain of the power amplifier will be low. In turn, the low gain requires significant drive power to be applied to the PA, resulting in low efficiency operation of the overall system. Thus, when operating as an RF amplifier, the present invention may typically use ternary signaling in which the controller 900 converts a modulated analog signal into a digital format to provide ternary signaling to the H-Bridge circuit 500.

Ternary signaling may offer advantages over two state binary signaling for the H-Bridge circuit 500 operating as a RF amplifier in a modulation system. Ternary signaling can be typically derived, for instance, when the H-Bridge circuit 500 and controller 900 form part of a Direct Digital to RF (hereinafter "DDRF") transmitter in which the H-Bridge circuit 500 operates as an RF amplifier. Such a DDRF transmitter provides an analog modulated carrier signal to the Delta-Sigma converter in the controller 900 that has a quantizer that outputs one of three logic levels (+1; 0; −1) that are mapped by the controller 900 and provides output drive signals D1 to D4 to the H-Bridge circuit 500. Thus, the controller 900 maps the analog modulated carrier signal to provide the ternary signaling to the H-Bridge circuit 500.

In ternary signaling three signaling states are mapped by the controller 900 in which a first state (+1 state) results in: (a) D1 and D3 providing logic high drive signals to the respective control inputs C1 and C3; and (b) D2 and D4 providing logic low drive signals to the respective control inputs C2 and C4. The logic high drive signals control the upper switched voltage supply circuit V1 to a logic high of −2 Volts and the lower switched voltage supply circuit V3 to a logic high of 0 Volts. Conversely, the logic low drive signals control the upper switched voltage supply circuit V2 to a logic low of −4 Volts and the lower switched voltage supply circuit V4 to a logic low of −2 Volts.

A second state (−1 state) of the ternary signaling results in: (a) D1 and D3 providing logic low drive signals to the respective control inputs C1 and C3; and (b) D2 and D4 providing logic high drive signals to the respective control inputs C2 and C4. The logic low drive signals control the upper switched voltage supply circuit V1 to a logic low of −4 Volts and the lower switched voltage supply circuit V3 to a logic low of −2 Volts. Conversely, the logic high drive signals control the upper switched voltage supply circuit V2 to a logic high of −2 Volts and the lower switched voltage supply circuit V4 to a logic high of 0 Volts.

A third state (0 state) of the ternary signaling can be typically achieved by one of two drive signal combinations. A first combination results in: (a) D1 and D2 providing logic low drive signals to the respective control inputs C1 and C2; and (b) D3 and D4 providing logic low drive signals to the respective control inputs C3 and C4. The logic low drive signals control the upper switched voltage supply circuits V1 and V2 to a logic low of −4 Volts and control the lower switched voltage supply circuits V3 and V4 to a logic low of −2 Volts. Alternatively, the third state (0 state) may be provided from a second combination that results in: (a) D1 and D2 providing logic high drive signals to the respective control inputs C1 and C2; and (b) D3 and D4 providing logic high drive signals to the respective control inputs C3 and C4. The logic high drive signals control the upper switched voltage supply circuits V1 and V2 to a logic high of −2 Volts control the lower switched voltage supply circuits V3 and V4 to a logic high of 0 Volts.

The above ternary signaling results in the following operation of the H-bridge circuit 500 in which the ternary signaling drives the upper switched voltage supply circuit and the lower switched voltage supply circuit of both sub-circuits into one of three states. In the first state (+1 state) transistors Q2 and Q3 are switched on and transistors Q1 and Q4 are switched off. Consequently, a load current flows from the first voltage supply node A+, through the upper transistor Q2, through the load L and band pass filters 590 and through the lower transistor Q3 to ground. In the second state (−1 state) transistors Q2 and Q3 are switched off and transistors Q1 and Q4 are switched on. Consequently, a load current flows from first voltage supply node A+, through the upper transistor Q1, through the load L and band pass filters 590 and through the lower transistor Q4 to ground. In the third state (0 state) using the first combination, the upper transistors Q1 and Q2 are switched on and the lower transistors Q3 and Q4 are switched off. In this configuration energy stored in the reactive elements of the band-pass filters 590 is allowed to discharge or "ring out" through the path containing the load L, upper transistors Q1 and Q2, and the capacitors which bypass supply node A+ to ground. This reduces the possibility of circuit or device destruction as well as the possibility of signal distortion when for instance the H-Bridge circuit is used as an RF amplifier. In the alternative third state (0 state) using the second combination, the upper transistors Q1 and Q2 are switched off and the lower transistors Q3 and Q4 are switched on. In this configuration energy stored in the reactive elements of the band-pass filters 590 is allowed to discharge or "ring out" through the path containing load L, the lower transistors Q3 and Q4 and ground. Again, this configuration reduces the possibility of circuit or device destruction as well as the possibility of signal distortion when for instance the H-Bridge circuit is used as an RF amplifier.

In contrast to binary (two state: +1, −1) signaling, the ternary (three state: −1, 0 +1) signaling format offers a system advantage when the H-Bridge is used as an RF power amplifier. Specifically, the advantage is realized when the H-Bridge must generate a signal waveform having a time-varying amplitude. Those skilled in the art will recognize such waveforms as non-constant envelope modulated signals, commonly characterized by a peak-to-average ratio. In binary signaling, only the time positioning of the transitions between the two states is available to control the instantaneous amplitude of the signal. The binary signal is a constant envelope waveform, providing a constant drive power to the H-Bridge, regardless of whether the desired output has a high or low instantaneous amplitude. To create a non-constant envelope output, binary signaling acts in the frequency domain to transfer energy between off-channel and on-channel spectral components. Statistically, however, the non-constant envelope signal created at the output of the H-Bridge has a low average power. Consequently, the use of constant envelope drive to create a non-constant envelope output results in low average stage gain for the H-Bridge power amplifier. Low stage gain is an undesirable property in that it reduces the power added efficiency of the H-Bridge. Ternary signaling minimizes the transfer of signal energy between off channel and on channel components when generating a non-constant envelope signal. The zero state described heretofore provides an additional degree of freedom which transforms the drive signal into a non constant envelope waveform. This provides the amplitude of the ternary drive signal with the ability to track the instantaneous signal amplitude produced at the output of the H-Bridge. When the H-Bridge produces a low instantaneous output amplitude, its ternary driving waveform has a correspondingly low instantaneous amplitude. Conversely, for high instantaneous output levels, the ternary drive level is high. In this manner, the H-Bridge avoids the stage gain reduction experienced with binary signaling, thereby improving its power added efficiency over binary signaling.

A further efficiency improvement may be realized by the choice of device pairs (Q1 and Q2, or Q3 and Q4) used to implement the zero state. The zero state created by turning on Q3 and Q4 requires logic level high drive signals to be provided by D1-D4 to control inputs C1-C4. In this case, drive power is required to generate a zero or "no output" state. Conversely, the operation of voltage-dependent non linear resistor 300 will turn on Q1 and Q2 by default, without application of drive power to any control input. In so doing, the average drive power applied to the H-Bridge and the current drain associated with the generation of the drive power is reduced, thereby improving efficiency. The low average value of non-constant envelope waveforms implies a high statistical likelihood of zero states. Using Q1 and Q2 to create the zero states is thus preferred.

Figure 10:
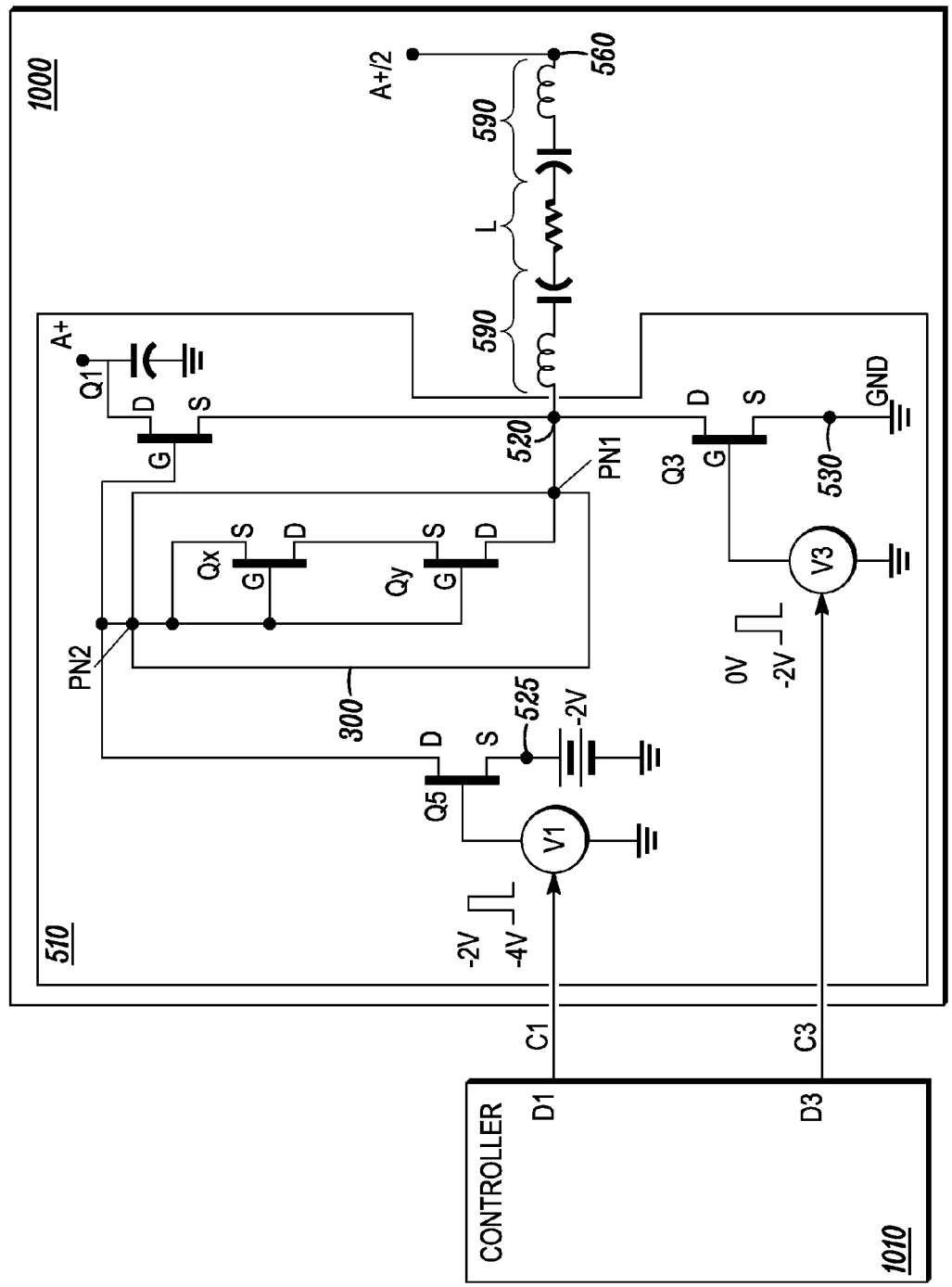
FIG. 10 is a schematic diagram illustrating an exemplary embodiment of a half H-Bridge circuit having control inputs of switched voltage supply coupled to a controller.

In FIG. 10 there is illustrated a half H-Bridge circuit 1000 comprising the sub-circuit 510 with the control inputs C1 to C3 of the voltage supply circuits V1 to V3 coupled to a controller 1010. The controller 1010 is typically a dedicated signal processor or part of a microprocessor that provides a mapping for multiple level signaling formats for the half H-Bridge circuit 1000. It will be apparent to a person skilled in the art that voltage dependent resistor VDR that is typically shown as the voltage dependent non-linear resistor 300 can be replaced with any voltage dependent resistor VDR such as, but not limited to, one of the voltage dependent non-linear resistors 600, 700, 800. In the half H-Bridge circuit 1000 the load node 560 is coupled to a reduced voltage supply node A+/2. When binary signaling is employed for this half H-Bridge circuit 1000, two signaling states are mapped by the controller 1010 in which a first state (+1 state) results in D1 and D3 providing logic high drive signals to the respective control inputs C1 and C3. Hence, the logic high drive signals control the upper switched voltage supply circuit V1 to a logic high of −2 Volts and the lower switched voltage supply circuit V3 to a logic high of 0 Volts.

A second state (−1 state) of the binary signaling results in D1 and D3 providing logic low drive signals to the control inputs C1 and C3. Hence, the logic low drive signals control the upper switched voltage supply circuit V1 to a logic low of −4 Volts and the lower switched voltage supply circuit V3 to a logic low of −2 Volts.

The aforementioned binary signaling results in the following operation of the half H-Bridge circuit 1000. In the first state (+1 state) a load current flows from the reduced voltage supply node A+/2 through the load L and band pass filters 590 and through the lower transistor Q2 to ground. In the second state (−1 state) a load current flows from first voltage supply node A+ through the upper transistor Q1, through the load L and band pass filters 590 and through the reduced voltage supply node A+/2 to ground.

As will be apparent to a person skilled in the art, the source electrode and drain electrode of a Field Effect Transistor are interchangeable. Thus, for a specific Field Effect Transistor, in any of the above embodiments, the first electrode may mean a source electrode and the second electrode can mean a drain electrode. Alternatively, for a specific Field Effect Transistor the first electrode may mean a drain electrode and the second electrode can mean a source electrode.

Advantageously, the present invention alleviates the need for relatively large gate to source voltage swings to control (switch) the upper transistors Q1 and Q2 in H-Bridge topologies. This is because the Voltage Dependent Resistor VDR, in combination with the other circuit components, provides a low resistance between the gate and source of an associated upper transistor, resulting in the transistor being switched on. The upper transistor is switched off through application of a negative bias to its gate, while its source is connected to ground when the lower transistor is turned on. When the upper transistor is switched off, the VDR presents a high resistance between the gate and source thereby minimizing current flowing into the negative bias supply.

It will be appreciated that the embodiment of the present invention described herein may be comprised of one or more conventional processors and unique stored program instructions that control the one or more processors to implement, in conjunction with certain non-processor circuits, some, most, or all of the functions the circuit as described herein. The non-processor circuits may include, but are not limited to, a radio receiver, a radio transmitter, signal drivers, clock circuits, power source circuits, and user input devices. As such, these functions may be interpreted as steps for controlling drive signals such as D1 to D4. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention. The benefits, advantages, solutions to problems, and any elements that may cause any benefit, advantage, or solution to occur or become more pronounced are not to be construed as critical, required, or essential features or elements of any or all of the claims. The invention is defined solely by the appended claims including any amendments made during the pendency of this application and all equivalents of those claims.

We claim:

1. A circuit comprising:
a depletion mode upper transistor with a second electrode coupled to a first electrode of a lower transistor;
a first voltage supply node coupled to a first electrode of the depletion mode upper transistor;
a second voltage supply node coupled to a second electrode of the lower transistor;
a load node disposed between the second electrode of the depletion mode upper transistor and the first electrode of the lower transistor;
an upper driver transistor selectively coupling a gate electrode of the depletion mode upper transistor to an upper drive voltage node, the upper driver transistor having a control electrode coupled to an upper switched voltage supply circuit;
a lower switched voltage supply circuit coupled to a gate electrode of the lower transistor; and
a voltage dependent resistor coupled across the gate electrode and second electrode of the depletion mode upper transistor, wherein in use when the lower transistor and upper driver transistor are in a non-conductive state, a potential difference across the voltage dependent resistor is sufficiently small so as to place the depletion mode upper transistor into a conductive state and when the lower transistor and upper driver transistor are in a conductive state, the potential difference across the voltage dependent resistor provides a bias voltage to the gate electrode of the depletion mode upper transistor that has a negative potential sufficient to place the depletion mode upper transistor into a non-conductive state.

2. A circuit as claimed in claim 1, wherein the voltage dependent resistor is in a low resistance state when a voltage across the gate electrode and second electrode of the depletion mode upper transistor is below 1 Volt and the voltage dependent resistor is in a high resistance state when a voltage across the gate electrode and second electrode of the depletion mode upper transistor is greater than 1.5 volts.

3. A circuit as claimed in claim 1, wherein the upper drive voltage node is connected to a voltage source that supplies a negative voltage of at least minus 2 volts.

4. A circuit as claimed in claim 1, wherein the second voltage supply node is coupled to ground.

5. A circuit as claimed in claim 1, wherein the circuit is a left sub-circuit of an H-bridge amplifier, the H-bridge amplifier also having a right sub-circuit that is identical to the left sub-circuit.

6. A circuit as claimed in claim 1, wherein a potential difference between the second voltage supply node and the upper drive voltage node is sufficient to place the depletion mode upper transistor into the non-conductive state.

7. A circuit as claimed in claim 1, wherein the voltage dependent resistor comprises at least two series connected depletion mode Field Effect transistors, a first one of the series connected depletion mode Field Effect transistors has a gate electrode and second electrode directly coupled together and a first electrode coupled to a second electrode of a second one of the series connected depletion mode Field Effect transistors, and the second one of the series connected depletion mode Field Effect transistors has a first electrode coupled to the second node of the depletion mode upper transistor, and wherein a gate electrode of the second one of the series connected depletion mode Field Effect transistors is directly coupled to the second electrode of the first one of the series connected depletion mode Field Effect transistors.

8. A circuit as claimed in claim 1, wherein the voltage dependent resistor comprises at least one depletion mode Field Effect transistor having a gate electrode and a second electrode directly coupled together and a first electrode of the depletion mode Field Effect transistor is coupled to the second electrode of the depletion mode upper transistor.

9. A circuit as claimed in claim 1, wherein the voltage dependent resistor comprises a gateless depletion mode Field Effect transistor with a first electrode of the gateless depletion mode Field Effect transistor is-coupled to the second electrode of the depletion mode upper transistor.

10. A circuit as claimed in claim 1, wherein the voltage dependent resistor comprises at least two series connected depletion mode Field Effect transistors a first one of the series connected depletion mode Field Effect transistors is a gateless Field Effect transistors with a first electrode coupled to a second electrode of a second one of the series connected depletion mode Field Effect transistors, and the second one of the series connected depletion mode Field Effect transistors has a first electrode coupled to the second electrode of the depletion mode upper transistor, and wherein a gate electrode of the second one of the series connected depletion mode Field Effect transistors is directly coupled to a second electrode of the first one of the series connected depletion mode Field Effect transistors.

11. A circuit as claimed in claim 5, wherein the circuit operates as an RF amplifier coupled to a controller that maps a modulation signal to provide a ternary signaling to the circuit.

12. A circuit as claimed in claim 11, wherein the ternary signaling drives the upper switched voltage supply circuit and the lower switched voltage supply circuit of both sub-circuits into one of three states, wherein a first of the states results in a load current flowing from the first voltage supply node through depletion mode upper transistor of the right sub-circuit, through the load and band pass filters and through the lower transistor of the left sub-circuit to ground, and wherein a second of the states results in a load current flowing from the first voltage supply node through depletion mode upper transistor of the left sub-circuit, through the load and band pass filters and through the lower transistor of the right sub-circuit to ground, and wherein a third of the states allows energy stored in the band pass filters to discharge through the lower transistor of both the left and right sub-circuit.

13. A circuit as claimed in claim 11, wherein the ternary signaling drives the upper switched voltage supply circuit and the lower switched voltage supply circuit of both sub-circuits into one of three states, wherein a first of the states results in a load current flowing from the first voltage supply node through depletion mode upper transistor of the right sub-circuit, through the load and band pass filters and through the lower transistor of the left sub-circuit to ground, and wherein a second of the states results in a load current flowing from the first voltage supply node through depletion mode upper transistor of the left sub-circuit, through the load and band pass filters and through the lower transistor of the right sub-circuit to ground, and wherein a third of the states results in a energy stored in the band pass filters to discharge through the depletion mode upper transistor of both the left and right sub-circuit.

14. An H-bridge circuit comprising two sub-circuits coupled to each other by a load network across a respective load node of each of the sub-circuits, each sub-circuit of the two sub-circuits comprising:
   a depletion mode upper transistor with a second electrode coupled to a first electrode of a lower transistor, wherein the load node of the sub-circuit is disposed between the second electrode of the depletion mode upper transistor and the first electrode of a lower transistor;
   a first voltage supply node coupled to a first electrode of the depletion mode upper transistor;
   a second voltage supply node coupled to a second electrode of the lower transistor;
   an upper driver transistor selectively coupling a gate electrode of the depletion mode upper transistor to an upper drive voltage node, the upper driver transistor having a control electrode coupled to an upper switched voltage supply circuit;
   a lower switched voltage supply circuit coupled to a gate electrode of the lower transistor; and
   a voltage dependent non-linear resistor coupled across the gate electrode and second electrode of the depletion mode upper transistor, wherein in use when the lower transistor and upper driver transistor are in a non-conductive state, a potential difference across the voltage dependent non-linear resistor is sufficiently small so as to place the depletion mode upper transistor into a conductive state and when the lower transistor and upper driver transistor are in a conductive state the potential difference across the voltage dependent non-linear resistor provides a bias voltage to the gate electrode of the depletion mode upper transistor that has a negative potential sufficient to place the upper transistor into a non-conductive state.

15. An H-bridge circuit as claimed in claim 14, wherein the voltage dependent resistor is in a low resistance state when a voltage across the gate electrode and second electrode of the depletion mode upper transistor is below 1 Volt and the voltage dependent non-linear resistor is in a high resistance state when a voltage across the gate electrode and second electrode of the depletion mode upper transistor is greater than 1.5 volts.

16. An H-bridge circuit as claimed in claim 14, wherein a potential difference between the second voltage supply node and the upper drive voltage node is sufficient to place the depletion mode upper transistor into the non-conductive state.

17. An H-bridge circuit as claimed in claim 14, wherein the circuit operates as an RF amplifier coupled to a controller maps a modulation signal to provide a ternary signaling to the circuit.

18. An H-bridge circuit as claimed in claim 17, wherein the ternary signaling drives the upper switched voltage supply circuit and the lower switched voltage supply circuit of both sub-circuits into one of three states, wherein a first of the states results in a load current flowing from the first voltage supply node through depletion mode upper transistor of the right one of the sub-circuits, through the load and band pass filters, and through the lower transistor of a left one of the sub-circuits to ground, and wherein a second of the states results in a load current flowing from the first voltage supply node through depletion mode upper transistor of the left one of the sub-circuits, through the load and band pass filters and through the lower transistor of the right one of the sub-circuits to ground, and wherein a third of the states results in a energy stored in the band pass filters to discharge through the lower transistor of both sub-circuits.

19. An H-bridge circuit as claimed in claim 17, wherein the ternary signaling drives the upper switched voltage supply circuit and the lower switched voltage supply circuit of both sub-circuits into one of three states, wherein a first of the states results in a load current flowing from the first voltage supply node through depletion mode upper transistor of right one of the sub-circuits, through the load and band pass filters and through the lower transistor of a left one of the sub-circuits to ground, and wherein a second of the states results in a load current flowing from the first voltage supply node through depletion mode upper transistor of the left one of the sub-circuits, through the load and band pass filters and through the lower transistor of the right one of the sub-circuits to ground, and wherein a third of the states results in a energy stored in the band pass filters to discharge through the depletion mode upper transistor of both sub-circuits.

20. A circuit comprising:
   a depletion mode upper transistor with a second electrode coupled to a first electrode of a lower transistor;
   a first voltage supply node coupled to a first electrode of the depletion mode upper transistor;
   a second voltage supply node coupled to a second electrode of the lower transistor;
   an output node disposed between the second electrode of the depletion mode upper transistor and the first electrode of a lower transistor;
   an upper driver transistor having a first electrode coupled to a gate electrode of the depletion mode upper transistor, a second electrode coupled to an upper drive voltage node and a gate electrode coupled to a upper switched voltage supply circuit;
   a lower switched voltage supply circuit coupled to a gate electrode of the lower transistor; and
   a voltage dependent resistor coupled across the gate electrode and second electrode of the depletion mode upper transistor, wherein the voltage dependent non-linear resistor is in a low resistance state when a voltage across the gate electrode and second electrode of the depletion mode upper transistor is below 1 Volt and the voltage dependent non-linear resistor is in a high resistance state when a voltage across the gate electrode and second electrode of the depletion mode upper transistor is greater than 1.5 volts.

21. A circuit as claimed in claim 20, wherein the circuit is a left sub-circuit of an H-bridge amplifier, the H-bridge amplifier also having a right sub-circuit that is identical to the left sub-circuit.

22. A circuit as claimed in claim 20, wherein a potential difference between the second voltage supply node and the upper drive voltage node is sufficient to place the depletion mode upper transistor into the non-conductive state.

23. A circuit as claimed in claim 20, wherein the circuit operates as an RF amplifier coupled to a controller that maps a modulation signal to provide a ternary signaling to the circuit.

24. A circuit as claimed in claim 23, wherein the ternary signaling drives the upper switched voltage supply circuit and the lower switched voltage supply circuit of both sub-circuits into one of three states, wherein a first of the states results in a load current flowing from the first voltage supply node through a depletion mode upper transistor of the right sub-circuit, through the load and band pass filters and through the lower transistor of the left sub-circuit to ground, and wherein a second of the states results in a load current flowing from the first voltage supply node through a depletion mode upper transistor of the left sub-circuit, through the load and band pass filters and through the lower transistor of the right sub-circuit to ground, and wherein a third of the states results in a energy stored in the band pass filters to discharge through the lower transistor of both the left and right sub-circuit.

25. A circuit as claimed in claim 23, wherein the ternary signaling drives the upper switched voltage supply circuit and the lower switched voltage supply circuit of both sub-circuits into one of three states, wherein a first of the states results in a load current flowing from the first voltage supply node through a depletion mode upper transistor of the right sub-circuit, through the load and band pass filters and through the lower transistor of the left sub-circuit to ground, and wherein a second of the states results in a load current flowing from the first voltage supply node through a depletion mode upper transistor of the left sub-circuit, through the load and band pass filters and through the lower transistor of the right sub-circuit to ground, and wherein a third of the states results in a energy stored in the band pass filters to discharge through the depletion mode upper transistor of both the left and right sub-circuit.

* * * * *